(12) United States Patent
Lee et al.

(10) Patent No.: US 7,671,364 B2
(45) Date of Patent: Mar. 2, 2010

(54) THIN FILM TRANSISTOR SUBSTRATE FOR DISPLAY UNIT

(75) Inventors: Woo-jae Lee, Gyeonggi-do (KR); Mun-pyo Hong, Gyeonggi-do (KR); Byoung-june Kim, Gyeonggi-do (KR); Sung-hoon Yang, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 66 days.

(21) Appl. No.: 11/489,144

(22) Filed: Jul. 18, 2006

(65) Prior Publication Data

US 2007/0090457 A1     Apr. 26, 2007

(30) Foreign Application Priority Data

Oct. 21, 2005    (KR)    ............... 10-2005-0099824

(51) Int. Cl.
*H01L 29/786* (2006.01)
(52) U.S. Cl. ................ 257/59; 257/E29.273
(58) Field of Classification Search .......... 257/E21.535, 257/E29.273, E51.005, 59
See application file for complete search history.

(56) References Cited

U.S. PATENT DOCUMENTS

| 5,350,605 | A | * | 9/1994 | Rostaing et al. | ............. | 427/536 |
| 5,399,387 | A | * | 3/1995 | Law et al. | ............. | 427/574 |
| 6,858,898 | B1 | * | 2/2005 | Hayakawa et al. | ............. | 257/347 |
| 2004/0079952 | A1 | | 4/2004 | Yamazaki | | |
| 2004/0110343 | A1 | * | 6/2004 | Machida et al. | ............. | 438/257 |
| 2005/0175831 | A1 | | 8/2005 | Kim | | |

FOREIGN PATENT DOCUMENTS

| JP | 04-271179 | 9/1992 |
| JP | 9-146080 | 6/1997 |
| JP | 2000269510 A | 9/2000 |
| JP | 2000340799 A | 12/2000 |
| JP | 2004-115733 | 4/2004 |
| JP | 2005-138389 | 6/2005 |
| KR | 2003-0004128 | 1/2003 |
| KR | 1020070043488 | 4/2007 |

OTHER PUBLICATIONS

Patent Abstracts of Japan, Publication No. 09-146080, Jun. 6, 1997, 1 p.
Patent Abstracts of Japan, Publication No. 2005-138389, Jun. 2, 2005.
Korean Patent Abstracts, Publication No. 1020030004128, Jan. 14, 2003, 1 p.

* cited by examiner

*Primary Examiner*—Minh-Loan T Tran
*Assistant Examiner*—W. Wendy Kuo
(74) *Attorney, Agent, or Firm*—Innovation Counsel LLP

(57) ABSTRACT

A thin film transistor (TFT) substrate comprises: a plastic insulation substrate; a first silicon nitride layer with a first refractive index, formed one surface of the plastic insulation substrate; and a TFT comprising a second silicon nitride layer formed with a second refractive index smaller than the first refractive index on the first silicon nitride layer. Thus, the present invention provides a TFT substrate wherein there is reduced a problem in that thin films are lifted from a plastic insulation substrate.

28 Claims, 7 Drawing Sheets

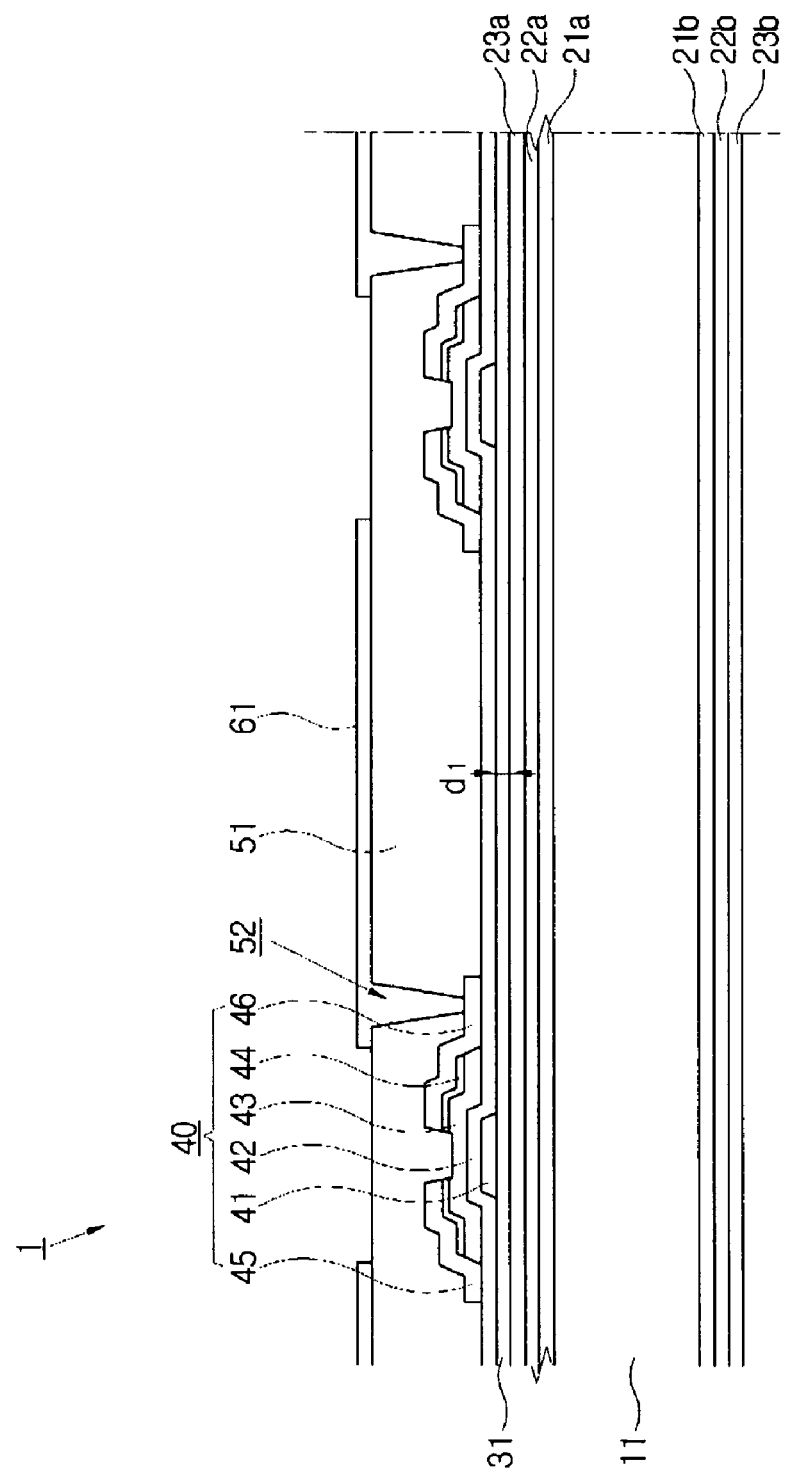

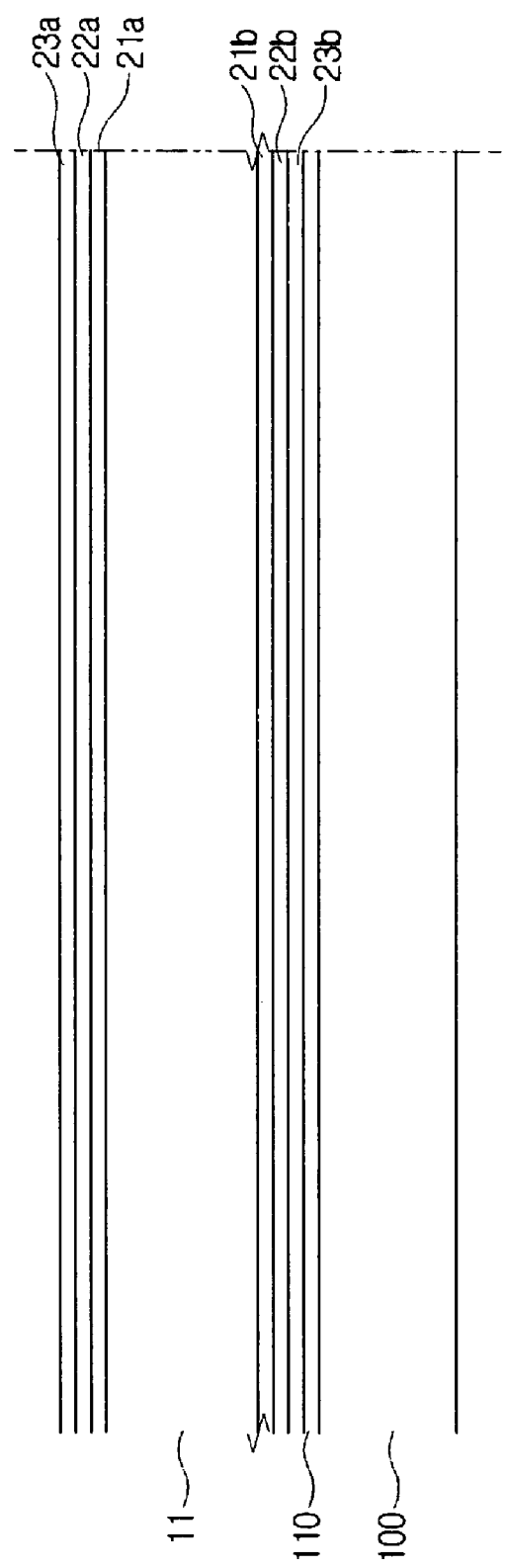

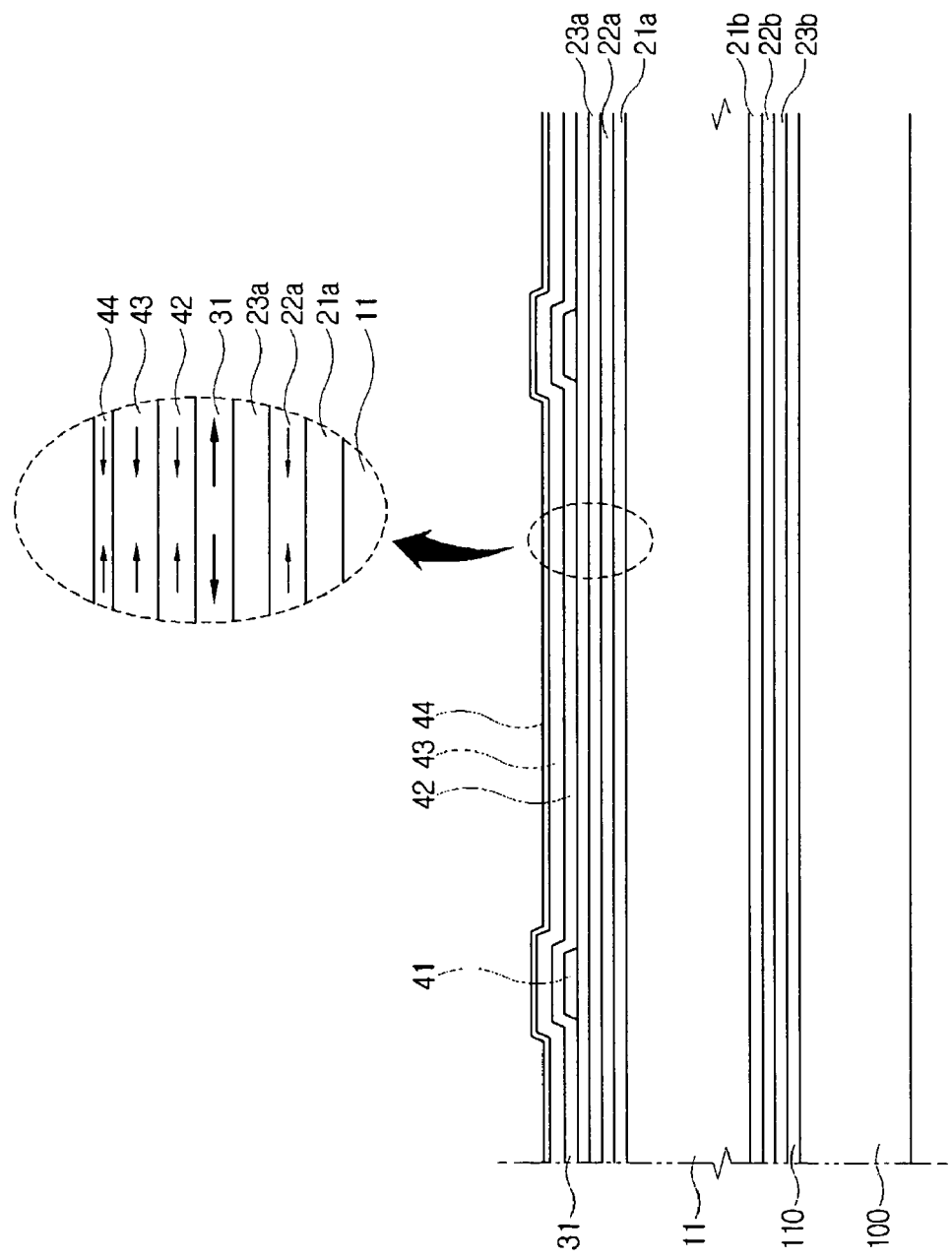

CONTRACTION

THIN FILM TRANSISTOR SUBSTRATE FOR DISPLAY UNIT

CROSS-REFERENCE TO RELATED APPLICATIONS

This application claims priority from Korean Patent Application No. 2005-0099824, filed on Oct. 21, 2005, in the Korean Intellectual Property Office, the disclosure of which is incorporated herein by reference.

FIELD OF INVENTION

The present invention relates to a thin film transistor (TFT) substrate and a method of fabricating the same, and more particularly, to a TFT substrate wherein lifting of thin films formed on a plastic insulation substrate is reduced and a method of fabricating the same.

DESCRIPTION OF THE RELATED ART

In recent years, liquid crystal displays (LCDs) and organic light-emitting diodes (OLEDs) have been more used as a substitute for existing cathode ray tubes (CRTs). An LCD comprises an LCD panel which comprises a first substrate having a TFT formed thereon, a second substrate arranged to face the first substrate and an LCD panel having a liquid crystal layer interposed therebetween. Since the LCD panel is a non-light emitting device, a backlight unit for radiating light may be located in a rear of the TFT substrate. Transmissivity of light radiated from the backlight unit depends on the orientation of the crystals in the LCD panel.

An OLED includes an organic light emitting layer formed on a TFT substrate. In the organic light emitting layer, light is emitted by the combination of a hole and an electron supplied from pixel electrodes and common electrodes. The OLED has a superior viewing angle to the LCD and does not need the backlight unit.

In recent years, the plastic insulation substrate has been increasingly substituted for the conventional glass insulation substrate in thin flat panel displays. On the plastic insulation substrate may be formed a variety of display elements including the TFT. However, there is a problem in that an inorganic thin film constituting the display element is not easily bonded to a plastic insulation substrate because of differing thermal coefficients of expansion between the two.

SUMMARY OF THE INVENTION

Accordingly, it is an aspect of the present invention to provide a TFT substrate better adhesion to a plastic insulation substrate. The foregoing and/or other aspects of the present invention can be achieved by providing a thin film transistor (TFT) substrate comprising: a plastic insulation substrate; a first silicon nitride layer with a first refractive index, formed one surface of the plastic insulation substrate; and a TFT comprising a second silicon nitride layer formed with a second refractive index smaller than the first refractive index on the first silicon nitride layer. According to an aspect of the present invention, the second refractive index is 1.9 or less. According to an aspect of the present invention, the thickness of the first silicon nitride layer is 100 nm to 800 nm. According to an aspect of the present invention, the first silicon nitride layer has a positive intrinsic stress value, i.e., has a tensile property and the second silicon nitride layer has a negative intrinsic stress value, i.e., has a compressive property.

According to an aspect of the present invention, the TFT substrate further comprises a hard coating layer interposed between the first silicon nitride layer and the plastic insulation substrate, and made of an acryl resin.

According to an aspect of the present invention, the TFT substrate further comprises a barrier coating layer which is interposed between the hard coating layer and the plastic insulation substrate and comprises at least one of an inorganic nitride layer, an inorganic oxide layer and an organic layer comprising acrylic layer.

According to an aspect of the present invention, the barrier coating layer is a two-layer structure composed of the organic layer and an inorganic layer.

According to an aspect of the present invention, the barrier coating layer comprises a third silicon nitride layer with a third refractive index larger than the second refractive index.

According to an aspect of the present invention, the TFT substrate further comprises a hard coating layer and a barrier coating layer sequentially laminated on the other surface of the plastic insulation substrate, wherein the hard coating layer comprises an acrylic resin and the barrier coating layer comprises at least one of an inorganic nitride layer, an inorganic oxide layer and an organic layer comprising an acrylic layer.

According to an aspect of the present invention, the first and the second silicon nitride layers are formed by a CVD (Chemical Vapor Deposition) method.

The foregoing and/or other aspects of the present invention can be achieved by providing a TFT substrate comprising: a plastic insulation substrate; a stress relaxation layer with a positive intrinsic stress value, formed on the plastic insulation substrate; and a TFT comprising an inorganic layer formed with a negative intrinsic stress value on the stress relaxation layer.

According to an aspect of the present invention, the inorganic layer comprises at least one of an insulation layer, a semiconductor layer and an ohmic contact layer.

According to an aspect of the present invention, the stress relaxation layer is made of silicon nitride, and its refractive index is 1.9 or less.

According to an aspect of the present invention, the TFT substrate further comprises a barrier coating layer with a negative intrinsic stress value, formed between the plastic insulation substrate and the stress relaxation layer.

The foregoing and/or other aspects of the present invention can be achieved by providing a method of fabricating a TFT substrate, comprising: forming a stress relaxation layer with a positive intrinsic stress value on a plastic insulation substrate; and forming a TFT comprising an inorganic layer with a negative intrinsic stress value on the stress relaxation layer.

According to an aspect of the present invention, the stress relaxation layer and the inorganic layer are made of silicon nitride.

According to an aspect of the present invention, the stress relaxation layer and the inorganic layer are formed by a PECVD (Plasma Enhanced Chemical Vapor Deposition) method.

According to an aspect of the present invention, plasma power in the formation of the stress relaxation layer is lower than that in the formation of the inorganic layer.

According to an aspect of the present invention, pressure in the formation of the stress relaxation layer is higher than that in the formation of the inorganic layer.

According to an aspect of the present invention, the ratio of nitrogen source/silicon source in the formation of the stress relaxation layer is larger than that in the formation of the inorganic layer.

BRIEF DESCRIPTION OF THE DRAWING

The above and/or other aspects and advantages of the prevent invention will become apparent from a reading of the ensuing description together with the drawing, in which:

FIG. 1 is a cross-sectional view of a TFT substrate according to a first embodiment of the present invention;

FIGS. 2a to 2d are cross-sectional views illustrating a method of fabricating a TFT substrate according to the first embodiment of the present invention.

DETAILED DESCRIPTION

Figure 2B:
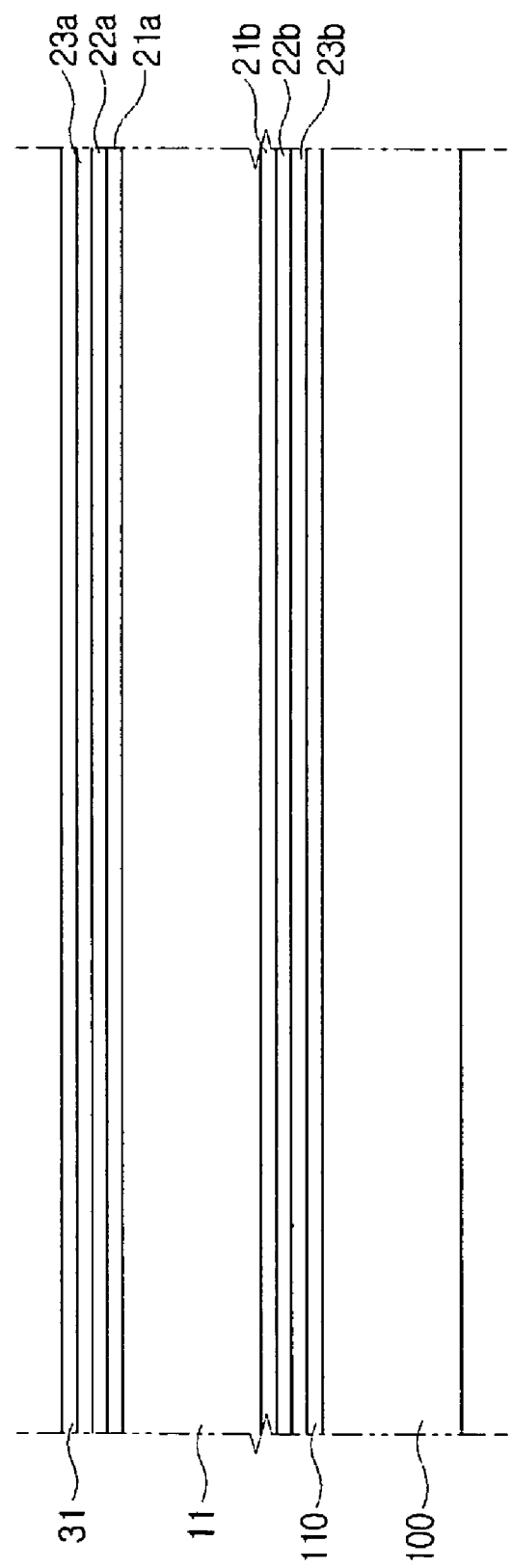

A TFT substrate according to a first embodiment of the present invention will be described with reference to FIG. 1. FIG. 1 is a cross-sectional view of a TFT substrate according to the first embodiment of the present invention. On both surfaces of a plastic insulation substrate 11 are sequentially formed undercoating layers 21a and 21b, barrier coating layers 22a and 22b, and hard coating layers 23a and 23b, respectively.

The plastic insulation substrate 11 may be made of polycarbon, polyimide, polyether sulfone (PES), polyarylate (PAR), polyethylenenapthalate (PEN), polyethylene terephthalate (PET) or the like.

The thickness of the plastic insulation substrate 11 is less than 0.2 mm and advantageously may be approximately 0.05 mm to 0.2 mm.

The undercoating layers 21a and 21b improve bonding between the plastic insulation substrate 11 and the barrier coating layers 22a and 22b, and are made of thermosetting acryl or ultraviolet curing acryl. In a case where bonding between the plastic insulation substrate 11 and the barrier coating layers 22a and 22b is good, e.g., in a case where the barrier coating layers 22a and 22b are made of an organic material, the undercoating layers 21a and 21b may be omitted.

The barrier coating layers 22a and 22b prevent oxygen or moisture from being permeated into the plastic insulation substrate 11. The barrier coating layers 22a and 22b may be made of an inorganic nitride film such as AlOxNy, Al, AlOx, SiOx, SiNx or Al2O3-SiO2, an inorganic oxide film, an organic film such as parylene, or the like. The barrier coating layers 22a and 22b may be formed as a two-layer structure of an inorganic film and an acrylic film. In a case where the barrier coating layers 22a and 22b include an inorganic layer such as a silicon nitride film, the inorganic layer is densely formed to prevent oxygen or moisture from being permeated.

The hard coating layers 23a and 23b prevent the plastic insulation substrate 11 from being damaged due to scratches and chemicals, and are made of thermosetting acryl or ultraviolet curing acryl. The hard coating layers 23a and 23b facilitate separation between the plastic insulation substrate 11 and a dummy substrate after forming a display element.

A stress relaxation layer 31 made of silicon nitride is formed on the hard coating layer 23a of the top of the plastic insulation substrate 11. The stress relaxation layer 31 relieves stress applied to thin films, which will be formed later, so that the stress relaxation layer 31 prevents lifting of the thin films. Detailed operations will be described later.

The stress relaxation layer 31 is more porous and has a lower refractive index as compared with a gate insulation layer 42 to be formed later. The refractive index of the stress relaxation layer 31 may be 1.9 or less.

The stress relaxation layer 31 has a positive intrinsic stress value. The positive intrinsic stress value means that when a thin film is formed on a silicon wafer, the thin film receives a force expanding outward, i.e., a positive intrinsic stress value means that a thin film formed on a silicon wafer has a tensile property. On the contrary, a negative intrinsic stress value means that when a thin film is formed on a silicon wafer, the thin film receives a force contracting inward, i.e., the thin film has a compressive property.

The thickness d1 of the stress relaxation layer 31 is 100 nm to 800 nm. In a case where the thickness d1 is 100 nm or less, a stress relaxation effect is negligible, and an excessive time is required to form more than 800 nm in thickness.

On the stress relaxation layer 31 is formed a TFT 40. The TFT 40 shows a case where amorphous silicon is used as a semiconductor layer 43 but is applicable to a case where poly silicon or organic semiconductor is used as the semiconductor layer 43.

The TFT substrate 40 comprises a gate electrode 41, a gate insulation layer 42, a semiconductor layer 43, an ohmic contact layer 44, a source electrode 45 and a drain electrode 46.

The gate insulation layer 42, the semiconductor layer 43 and the ohmic contact layer 44 are made of silicon nitride, amorphous silicon and n+ amorphous silicon, respectively. In a fabricating process, the gate insulation layer 42, the semiconductor layer 43 and the ohmic contact layer 44 are consecutively formed through a PECVD (Plasma Enhanced Chemical Vapor Deposition) method. The quality of such a triple layer is densely formed to enhance the performance of the TFT 40, and the triple layer has a negative intrinsic stress value.

Although the gate insulation layer 42 is made of silicon nitride as is the stress relaxation layer 31, there are differences between the stress relaxation layer 31 and the gate insulation layer 42 in degree of density, refractive index and intrinsic stress value.

On the TFT 40 are formed a passivation film 51 and a pixel electrode 61. The passivation film 51 is made of an inorganic film such as silicon nitride or an organic film, and the pixel electrode 61 is made of a transparent conductive material such as ITO (Indium Tin Oxide) or IZO (Indium Zinc Oxide). The pixel electrode 61 is connected with a drain electrode 46 of the TFT 40 through a contact hole 52 formed on the passivation film 51.

The TFT substrate 1 is bonded with another substrate with liquid crystal interposed therebetween so that it can be used as an LCD, or the TFT substrate 1 can be also used as an OLED by forming an organic light emitting layer and a common electrode on the pixel electrode 61.

The method of fabricating a TFT substrate using a dummy glass substrate according to the first embodiment of the present invention will be described with reference to FIGS. 2a to 2d and FIGS. 3a and 3b.

Figure 2D:
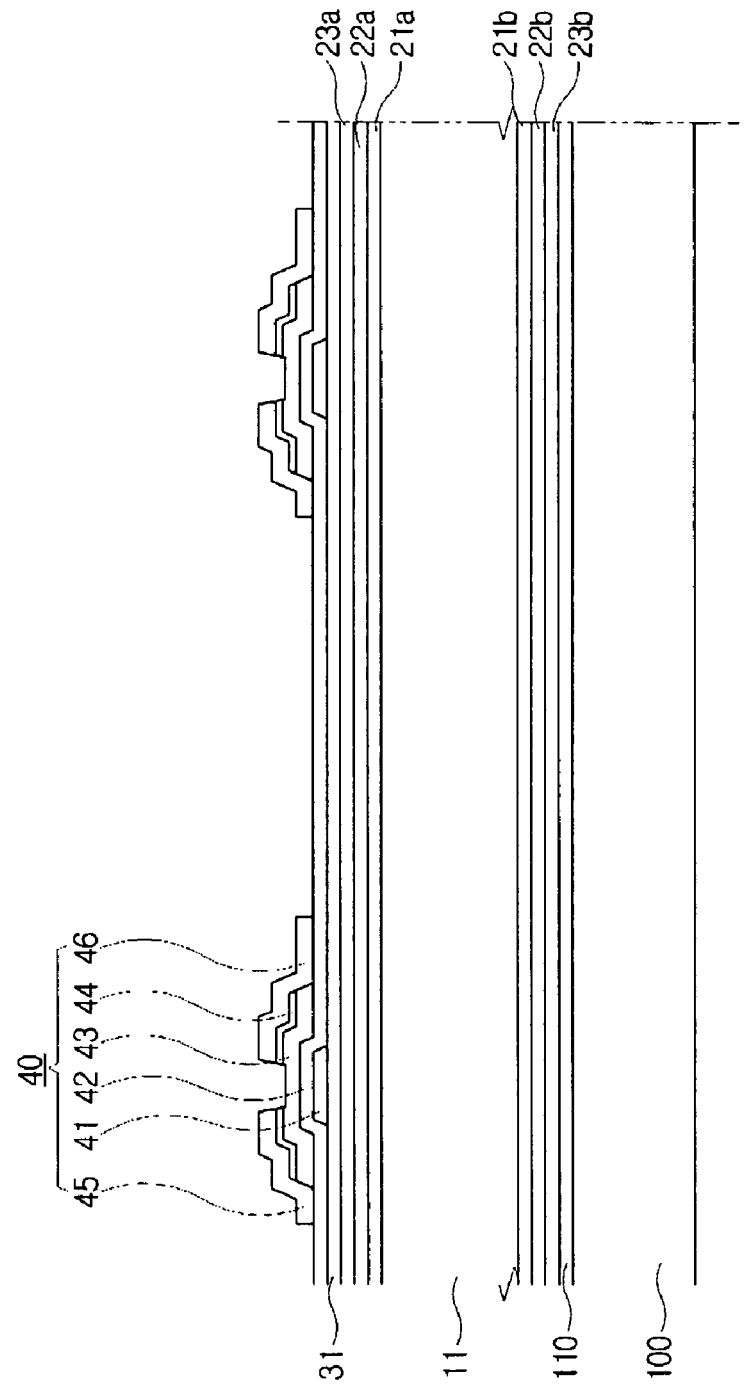
Figure 3A:
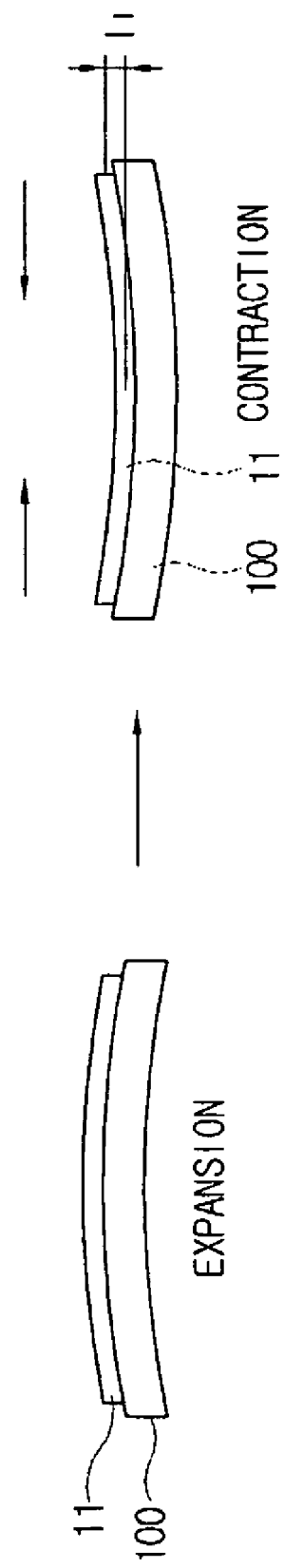
FIGS. 3a and 3b are views illustrating a modification of a plastic insulation substrate.
Figure 3B:
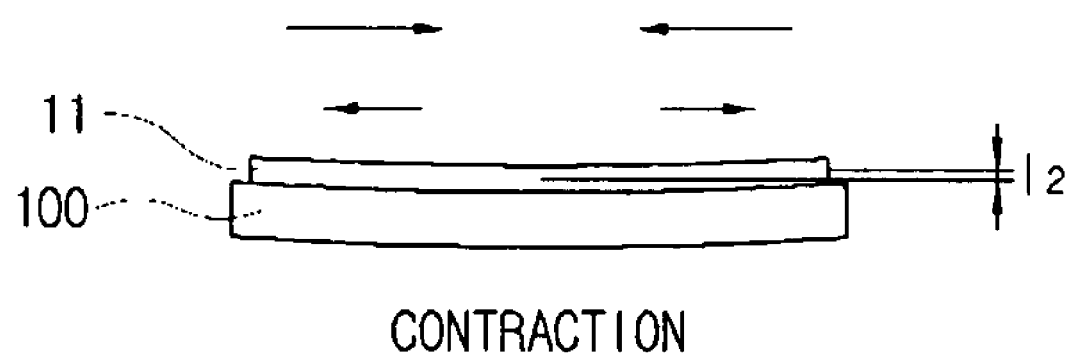

FIGS. 2a to 2d are cross-sectional views illustrating a method of fabricating a TFT substrate according to the first embodiment of the present invention, and FIGS. 3a and 3b are views illustrating a modification of a plastic insulation substrate.

First, a plastic insulation substrate 11 is attached on a dummy substrate 100 using an adhesive agent 110 as shown in FIG. 2a. Since the plastic insulation film 11 has a problem in that the plastic insulation film 11 is not only thin but also easily warped by heat, the plastic insulation substrate 11 is supported by the dummy substrate 100 during processing. The dummy substrate 100 is made of glass, SUS, plastic or the like. Because an SUS dummy substrate is heavy even though processed as thin as possible, it is difficult to use in spin coating. A plastic dummy substrate is required to have a considerable thickness as a support but is not suitable for use in a high temperature process. Thus, glass is frequently used because it has the property of being flat and strong and resistant to heat and various kinds of chemicals.

Sequentially formed on both surfaces of the attached plastic insulation substrate 11 are undercoating layers 21a and 21b, barrier coating layers 22a and 22b, and hard coating layers 23a and 23b, respectively. Barrier coating layer 22a of the top of the plastic insulation substrate 11 is made of an inorganic material and has a negative intrinsic stress value.

Alternatively, at least a portion of undercoating layer 21a, barrier coating layer 22a and hard coating layer 23a of the top of the plastic insulation substrate 11 may be formed so that plastic insulation substrate 11 is attached to dummy substrate 100.

Adhesive agent 110 may be a low-temperature removable type in which its adhesive strength is lost at a predetermined temperature or less. The adhesion of the plastic insulation substrate 11 and the dummy substrate 100 may be achieved through a method wherein plastic insulation substrate 11 is attached to dummy substrate 100 after the adhesive agent 110 is applied on one surface of the plastic insulation substrate 11.

In a case where the plastic insulation substrate 11 is used, the process temperature should be sustained within 150 to 200° C., which is the thermal tolerance of the plastic insulation substrate 11.

Then, a stress relaxation layer 31 is formed as shown in FIG. 2b. The stress relaxation layer 31 is formed through a PECVD (Plasma Enhanced Chemical Vapor Deposition) method. At this time, the deposition temperature is preferably 120 to 200° C., and more preferably 130 to 160° C.

A gate insulation layer 42 to be formed later is also formed through the PECVD (Plasma Enhanced Chemical Vapor Deposition) method. Forming conditions between the stress relaxation layer 31 and the gate insulation layer 42 will be compared as follows.

Since the stress relaxation 31 and the gate insulation layer 42 are made of silicon nitride, there is needed a nitrogen source and a silicon source. The ratio of the nitrogen source/silicon source in the formation of the stress relaxation layer 31 is larger than that of the nitrogen source/silicon source in the formation of the gate insulation layer 42. That is, the stress relaxation layer 31 has a higher nitrogen content as compared with the gate insulation layer 42. Ammonia (NH3) may be used as the nitrogen source, and silane (SiH4) may be used as the silicon source.

In another process factor, plasma power applied for the formation of plasma is lower when the stress relaxation layer 31 is formed, total pressure in reaction is higher when the stress relaxation layer 31 is formed, and a degree of hydrogen dilution is lower when the stress relaxation layer 31 is formed.

In such conditions, the stress relaxation layer 31, which has a lower density of film quality and refractive index as compared with the gate insulation layer 42, is formed. Further, the stress relaxation layer 31 has a positive intrinsic stress value, and the gate insulation layer 42 has a negative intrinsic stress value.

Then, on the stress relaxation layer 31 are formed a gate wire 41, a gate insulation layer 42, a semiconductor layer 43 and an ohmic contact layer 44 as shown in FIG. 2c. Here, the gate insulation layer 42, the semiconductor layer 43 and the ohmic contact layer 44 are consecutively formed as the triple layer using CVD (Chemical Vapor Deposition) method. Since the triple layer and the stress relaxation layer 31 are made of an inorganic material, the adhesive strength therebetween is satisfactory.

Such a triple layer is densely formed to improve its quality and has a force contracted inward because the triple layer has a negative intrinsic stress value. Meanwhile, the barrier layer 22a is densely formed to prevent moisture and oxygen from being permeated so that the barrier layer 22a also has a negative intrinsic stress value.

As such, all of the gate insulation layer 42, the semiconductor layer 43, the ohmic contact layer 44 and the barrier layer 22a receive stress in the same direction. On the other hand, since the stress relaxation layer 31 has a positive intrinsic stress value so that it has a property of expanding outward, the stress relaxation layer 31 can relieve stress. Accordingly, there can be reduced a problem in that the gate insulation layer 42, the semiconductor layer 43 and the ohmic contact layer 44 are lifted. Further, the stress relaxation layer 31 and the gate insulation layer 42 are all made of an inorganic material so that mutual adhesive strength is superior, thereby preventing lifting thereof.

According to the present invention, since the stress relaxation layer 31 prevents thin films from being lifted, the semiconductor layer 43 is more densely fabricated so that characteristics of the TFT 40 can be enhanced.

Meanwhile, the formation of the triple layer is executed at a considerably high temperature, and the plastic insulation substrate 11 may be modified in this process. The modification of the plastic insulation substrate 11 may promote lifting of thin films. The modification of the plastic insulation substrate 11 will be described with reference to FIGS. 3a and 3b.

As shown in FIG. 3a, if heat is applied, the dummy substrate 100 and the plastic insulation substrate 11 are all expanded. In a case where the material of the dummy substrate 100 is glass, since the thermal expansion coefficient of the plastic insulation substrate 11 is larger than that of the dummy substrate 100, the center portion of the plastic insulation substrate 11 is modified such that the center portion thereof faces upward. The thermal expansion coefficient of the plastic insulation substrate 11 may be 10 to 30 times larger than that of the dummy substrate 100. In a case where a process temperature is more than 130° C., such expansion causes a problem.

Meanwhile, the dummy substrate 100 and the plastic insulation substrate 11 are all contracted in a cooling process. In this process, moisture and air is permeated into the plastic insulation substrate 11 so that the contraction of the plastic insulation substrate 11 is more promoted. Accordingly, the plastic insulation substrate 11 is modified such that the center portion thereof faces downward. A modification degree 11 of the plastic insulation substrate 11 is defined as the height difference between the center and the end thereof. However, since most thin films formed on the plastic insulation substrate 11 in the contracting process are densely formed so that they intend to contract inward, the modification of the plastic insulation substrate 11 becomes larger.

However, as shown in FIG. 3b, if there is one of the films which intends to expand outward, a modification degree 12 of the plastic insulation substrate 11 can be reduced.

As described in FIGS. 3a and 3b, the stress relaxation layer 31 can also reduce the modification of the plastic insulation substrate 11. Meanwhile, the barrier coating layers 22a and 22b formed on both the surfaces of the plastic insulation substrate 11 prevent moisture and oxygen from being permeated so that the modification of the plastic insulation substrate 11 can be reduced.

Then, as shown in FIG. 2d, the semiconductor layer 43 and the ohmic contact layer 44 are patterned, and the source and the drain electrodes 45 and 46 are formed so that the process of fabricating the TFT 40 is completed. Etchant and cleaning liquid are used in the patterning process, and the hard coating layers 23a and 23b prevent such chemicals from being permeated into the plastic insulation substrate 11.

Then, if necessary, a pixel electrode and an organic light emitting layer are formed on the TFT 40 so that an OLED may be manufactured, or a pixel electrode is formed and then bonded with another substrate so that an LCD may be manufactured.

The aforementioned embodiments may be variously modified. If the stress relaxation layer 31 has a positive intrinsic stress value, the stress relaxation layer 31 may be made of another inorganic material such as silicon oxide. Besides, The configuration and arrangement order of the undercoating layers 21a and 21b, the barrier coating layers 22a and 22b, and the hard coating layer 23a and 23b may be changed if necessary.

As described above, according to the present invention, there is provided a TFT substrate and a manufacturing method therefor yielding a TFT substrate wherein lifting of the thin film from a plastic insulation substrate is prevented.

Although a few exemplary embodiments of the present invention have been shown and described, it will be apparent to those skilled in the art that modifications and changes may be made without, however, departing from the spirit and scope of the invention.

What is claimed is:

1. A thin film transistor (TFT) substrate comprising:
   a plastic insulation substrate;
   a first barrier coating layer formed on one surface of the plastic insulation substrate;
   a first hard coating layer formed on the first barrier coating layer;
   a first silicon nitride layer with a first refractive index, formed on the first hard coating layer;
   a TFT comprising a second silicon nitride layer with a second refractive index, wherein the second silicon nitride layer is formed on the first silicon nitride layer;
   a second barrier coating layer formed on the other surface of the plastic insulation substrate;
   a second hard coating layer formed on the second barrier coating layer, and
   wherein the second refractive index is larger than the first refractive index.

2. The TFT substrate according to claim 1, wherein the first silicon nitride layer has positive intrinsic stress value and the second silicon nitride layer has a negative intrinsic stress value.

3. The TFT substrate according to claim 2, wherein the first refractive index is 1.9 or less.

4. The TFT substrate according to claim 3, wherein a ratio of nitrogen source/silicon source in the formation of the first silicon nitride layer is larger than that in the formation of the second silicon nitride layer.

5. The TFT substrate according to claim 4, wherein a thickness of the first silicon nitride layer is 100nm to 800nm.

6. The TFT substrate according to claim 3, wherein a thickness of the first silicon nitride layer is 100nm to 800nm.

7. The TFT substrate according to claim 2, wherein a ratio of nitrogen source/silicon source in the formation of the first silicon nitride layer is larger than that in the formation of the second silicon nitride layer.

8. The TFT substrate according to claim 7, wherein a thickness of the first silicon nitride layer is 100nm to 800nm.

9. The TFT substrate according to claim 2, wherein a thickness of the first silicon nitride layer is 100nm to 800nm.

10. The TFT substrate according to claim 1, wherein the first refractive index is 1.9 or less.

11. The TFT substrate according to claim 10, wherein a ratio of nitrogen source/silicon source in the formation of the first silicon nitride layer is larger than that in the formation of the second silicon nitride layer.

12. The TFT substrate according to claim 11, wherein a thickness of the first silicon nitride layer is 100nm to 800nm.

13. The TFT substrate according to claim 10, wherein a thickness of the first silicon nitride layer is 100nm to 800nm.

14. The TFT substrate according to claim 1, wherein a ratio of nitrogen source/silicon source in the formation of the first silicon nitride layer is larger than that in the formation of the second silicon nitride layer.

15. The TFT substrate according to claim 14, wherein a thickness of the first silicon nitride layer is 100nm to 800nm.

16. The TFT substrate according to claim 1, wherein a thickness of the first silicon nitride layer is 100nm to 800nm.

17. The TFT substrate according to claim 1, further comprising at least one of a under coating layers formed between the first and second barrier coating layers and the substrate.

18. The TFT substrate according to claim 17, wherein the first and second hard coating layers comprise an acryl resin.

19. The TFT substrate according to claim 17, wherein the first and second barrier coating layers comprise at least one of an inorganic nitride layer, an inorganic oxide layer, and an organic layer comprising acrylic layer.

20. The TFT substrate according to claim 19, wherein the first and second barrier coating layers are a two-layer structure composed of the organic layer and an inorganic layer.

21. The TFT substrate according to claim 17, wherein the first and second barrier coating layers comprise a third silicon nitride layer with a third refractive index larger than the second refractive index.

22. The TFT substrate according to claim 1, wherein the first and second hard coating layers comprise an organic layer.

23. A TFT substrate comprising:
   a plastic insulation substrate;
   a first barrier coating layer formed on one surface of the plastic insulation substrate;
   a first hard coating layer formed on the first barrier coating layer;
   a stress relaxation layer with a positive intrinsic stress value, formed on the first hard coating layer;
   a TFT comprising an inorganic layer with a negative intrinsic stress value, wherein the inorganic layer is formed on the stress relaxation layer;
   a second barrier coating layer formed on the other surface of the plastic insulation substrate; and
   a second hard coating layer formed on the second barrier coating layer.

24. The TFT substrate according to claim 23, wherein the inorganic layer comprises at least one of an insulation layer, a semiconductor layer and an ohmic contact layer.

25. The TFT substrate according to claim 23, wherein a refractive index of the stress relaxation layer is smaller than a refractive index of the inorganic layer.

26. The TFT substrate according to claim 25, wherein the stress relaxation layer is made of silicon nitride and its refractive index is 1.9 or less.

27. A thin film transistor (TFT) substrate comprising:
   a plastic insulation substrate having two surfaces;
   a barrier coating layer and a hard coating layer formed on each of the surfaces;
   a stress relaxation layer with a positive intrinsic stress value, formed on one of the hard coating layers; and a TFT having a gate electrode and a gate insulation layer with a negative intrinsic stress value, wherein the gate insulation layer is formed on the stress relaxation layer, wherein a nitrogen content of the stress relaxation layer is larger than a nitrogen of the gate insulation layer.

28. The TFT substrate according to 27, wherein a refractive index of the gate insulation layer is larger than a refractive index of the stress relaxation layer.

* * * * *